United States Patent [19]
Gilbert

[11] Patent Number: 5,489,878
[45] Date of Patent: Feb. 6, 1996

[54] CURRENT-CONTROLLED QUADRATURE OSCILLATOR BASED ON DIFFERENTIAL $G_M/C$ CELLS

[75] Inventor: Barrie Gilbert, Portland, Oreg.

[73] Assignee: Analog Devices, Norwood, Mass.

[21] Appl. No.: 344,361

[22] Filed: Nov. 23, 1994

[51] Int. Cl.[6] .................................. H03B 5/02; H03B 5/06
[52] U.S. Cl. ........................ 331/57; 331/115; 331/135; 331/177 R
[58] Field of Search ........................ 331/57, 108 R, 331/111, 114, 115, 135, 136, 177 R

[56] References Cited

U.S. PATENT DOCUMENTS 5,172,076  12/1992  Brown ............................ 331/57

OTHER PUBLICATIONS

Gilbert, Barrie, "Current–mode Circuits From A Tranlinear Viewpoint: A Tutorial" from *Analogue IC Design: The Current–mode Approach*, Toumazou, Lidgey, Haigh, eds. Peter Peregrinus, Ltd., London 1990.

Excerpt from *Nonlinear Circuits Handbook*, Daniel Sheingold, ed., Analog Devices, Inc., Norwood, Mass. 1976.

Primary Examiner—Siegfried H. Grimm
Attorney, Agent, or Firm—Marger, Johnson, McCollom & Stolowitz

[57] ABSTRACT

An oscillator including two gm/C stages is disclosed. Each gm/C stage includes a differential pair of transistors, a capacitor, and a tunable current source. Alternatively, multi-tanh n-tuplets can be used in place of the differential pairs in the gm/C stages to increase the linearity of the gm/C stage. The gm/C stages include a pair of input terminals, a pair of output terminals, and a pair of common-mode terminals. The two gm/C stages are interconnected in a feedback loop to form a quadrature oscillator. A common-mode biasing circuit is coupled a supply voltage and each pair of common-mode terminals for biasing the respective gm/C stage. The common-mode biasing circuits can include: current mirrors, diode pairs, and even resistors. An optional start-up circuit can be coupled to each gm/C stage to ensure start-up of the associated gm/C stage. The start-up circuit includes a pair of cross-coupled transistors in order to form a negative resistance so as to compensate for the impedance of the subsequent gm/C stage.

41 Claims, 8 Drawing Sheets

CURRENT-CONTROLLED QUADRATURE OSCILLATOR BASED ON DIFFERENTIAL $G_M/C$ CELLS

BACKGROUND OF THE INVENTION

This invention relates generally to communication systems and more particularly to oscillators therefor.

Oscillators are of fundamental importance in communication systems. These systems have exacting requirements for oscillators. These requirements include: spectral purity, including short term frequency stability, often expressed in terms of phase noise, and harmonic distortion (deviation from ideal waveform); ease of frequency control (including, in some instances, wide tuning range); and low power consumption. In addition, ease of integration in monolithic form is often an additional requirement since most commercial communication systems must now be manufacturable at a low cost.

Low phase noise is especially critical in communication systems. For example, consider an oscillator operating at 1 GHz driving a mixer in a narrow-band FM radio application. If the short-term frequency varies in a random fashion, with a normal standard deviation of only 10 parts per million, the resulting base band signal will have a noisy frequency modulation of 10 kHz RMS, which may be two to three times the variation due to the signal modulation, making it useless. Accordingly, the phase noise of a high frequency oscillator in a communication system must be extremely low.

One class of oscillators that has been used in communication systems are those depending on time-constants formed by capacitors (C) and resistors (R). Within this category are so-called relaxation oscillators (multivibrators), which use at least one capacitor, and filter-based CR oscillators, which require at least two capacitors. This class of oscillators, along with all other oscillators, achieve an oscillatory condition by connecting two nominally ideal integrator stages in a loop including a sign change. A model of this type of oscillator is shown in FIG. 1.

Figure 1:
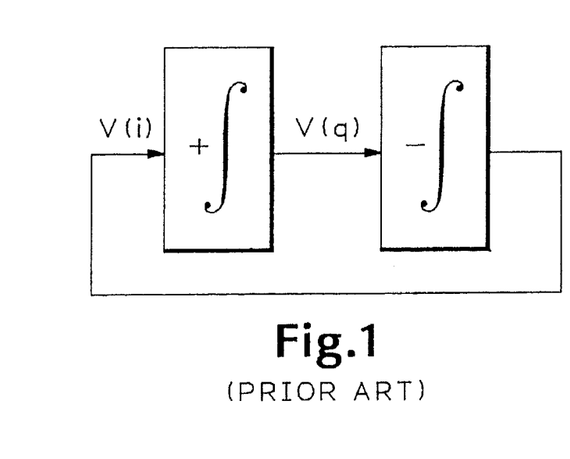
FIG. 1 is a model for a prior art quadrature oscillator.

The model in FIG. 1 includes a non-inverting integrator followed by an inverting integrator with the output of the inverting integrator connected to the input of the non-inverting integrator to form a closed loop. Because the non-inverting integrator introduces a constant phase lag of 90 degrees, the output signal of the non-inverting integrator V(q) has a constant phase lag of 90 degrees relative to the input signal V(i). As such, the output signal is said to be "in quadrature" with the input signal. Accordingly, oscillators that can be modeled as shown in FIG. 1 are called quadrature oscillators.

Figure 2:
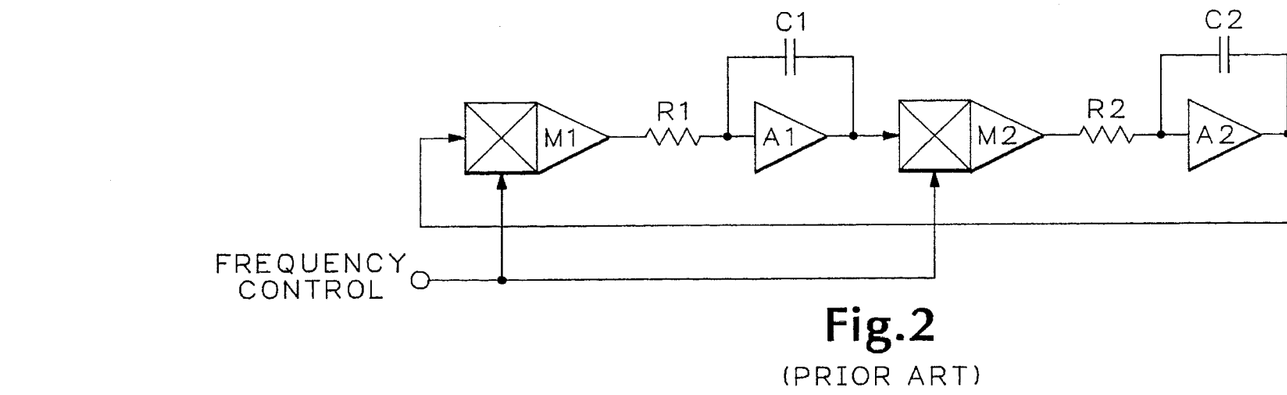
FIG. 2 is a current-controllable state-variable oscillator.

A popular implementation of the oscillator modeled in FIG. 1 is shown in FIG. 2. The oscillator of FIG. 2 includes two op-amps A1 and A2, each configured as an integrator by having a capacitor coupled between the input and the output of the associated op-amp. The oscillator of FIG. 2 also includes two multiplier circuits M1 and M2 that are used to tune the oscillator to a desired frequency of oscillation. The multipliers effectively vary the time constant associated with each integrator stage responsive to a frequency control signal applied thereto. Implementation shown in FIG. 2 is referred to as a voltage-controllable state-variable oscillator.

The voltage controllable state-variable oscillator of FIG. 2 is fundamentally unsatisfactory for high frequency, low phase noise applications. The primary reason for this is that the op-amp itself is fundamentally an integrator, even without the addition of the capacitor. Indeed, op-amps are consciously designed to be integrators, though generally not suited for direct use as such. An internal resistor (which sets the gm of the op-amp input stage) and an internal capacitor form a dominant pole in the op-amp which introduces an additional 90 degrees of phase lag in the integrator circuit at high frequencies. In addition, the dominant pole produces a change in the amplitude slope of the integrator. This dominant pole limits the state-variable oscillator to quite low frequencies. Moreover, the finite bandwidth of the multipliers imposes an additional limitation on the upper end of the frequency range which can be attained by the voltage-controllable state-variable oscillator.

Accordingly, a need remains for a high-frequency oscillator having improved phase noise.

SUMMARY OF THE INVENTION

It is, therefore, an object of the invention to improve the phase noise of quadrature oscillators.

A current-controlled quadrature oscillator based on differential gm/C cells is described. The oscillator according to the invention includes first and second gm/C integrator stages. The gm/C integrator stages or cells are based on the relationship between the transconductance (gm) and the collector current (Ic), referred to herein as the translinear relationship. This known, but not widely adopted, view of the bipolar junction transistor allows the frequency of oscillation to be tuned across an extremely large frequency range. The oscillator based on these cells achieves high frequency oscillation with minimal phase noise.

The use of the gm/C stages in the oscillator also allows the oscillator to include cascaded stages of differential pairs arranged in so-called multi-tanh n-tuplets. These multi-tanh n-tuplets improve the linearity of the transconductance (gm) of the gm/C stages.

The oscillator according to the invention also includes a plurality of common-mode biasing means used to bias the gm/C stages. In one embodiment, the common-mode biasing means includes a pair of common-mode transistors coupled between a positive supply voltage and a pair of common-mode terminals of the associated gm/C stage, and a common-mode biasing transistor having a control terminal coupled to the other gm/C integrator stage and a load terminal coupled to the control terminals of the first pair of common-mode transistors. In another embodiment of the common-mode biasing means, two current mirrors are used. In a further embodiment, two diodes are connected in series and coupled to each of the common-mode terminals of the Gm/C stages. In a yet further embodiment of the biasing means, resistors are used.

Some embodiments to the invention further include a start-up means coupled to the pair of output terminals of the gm/C stages. The start-up means includes a pair of cross-coupled transistors coupled to the pair of output terminals and a biasing current source coupled to the pair of cross-coupled transistors. The start-up means is designed to have a negative input resistance whose absolute value is equal to or greater than the input resistance of the next gm/C integrator stage. This start-up means forces the poles of the gm/C stages onto the right-hand plane to ensure oscillation. An oscillation amplitude limiting means is used to keep the amplitude of the oscillations within bounds.

An advantage of the invention is the oscillator's suitability for bipolar monolithic realization.

Another advantage of the invention is a wide tuning range of the oscillator.

Another advantage of the invention is guaranteed start-up of the oscillator.

Another advantage of the invention is low voltage operation of the oscillator.

A further advantage of the invention is low power operation of the oscillator.

A yet further advantage of the invention is good quadrature accuracy of the oscillator.

The foregoing and other objects, features and advantages of the invention will become more readily apparent from the following detailed description of a preferred embodiment of the invention which proceeds with reference to the accompanying drawings.

DETAILED DESCRIPTION

Figure 3:
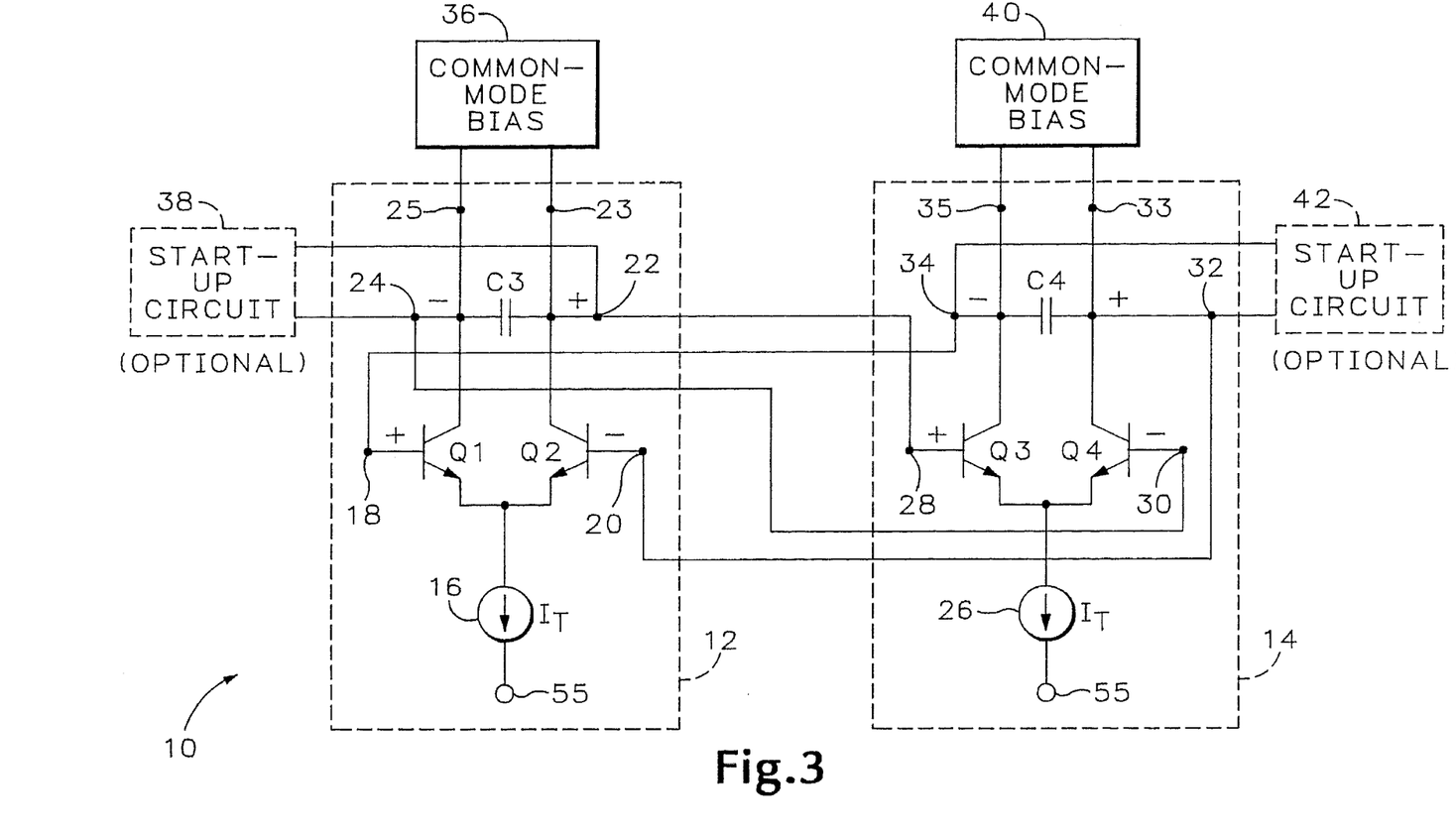
FIG. 3 is a schematic diagram of a current-controlled quadrature oscillator according to the invention.

Referring now to FIG. 3, a current-controlled quadrature oscillator according to the invention is shown. The oscillator 10 includes a first gm/C stage 12 and a second gm/C stage 14. Each gm/C stage is comprised of, in its essence, a differential pair of transistors, a capacitor, and a tunable current source.

The first gm/C stage includes a pair of input terminals 18 and 20, a pair of output terminals 22 and 24, and a pair of common mode terminals 23 and 25. The first gm/C stage also includes a tunable current source 16 by which, as will be shown hereinbelow, the frequency of oscillation can be tuned over a large frequency range. A capacitor C3 is coupled across the output terminals 22 and 24 to introduce a dominant pole, i.e., an integration function.

Similarly, the second gm/C stage 14 includes a pair of input terminals 28 and 30, a pair of output terminals 32 and 34, and a pair of common mode terminals 33 and 35. The second gm/C stage also includes tunable current source 26. A capacitor C4 is coupled across the output terminals 32 and 34. In the preferred embodiment, both capacitors C3 and C4 are formed by placing two physical capacitors back to back, wherein the capacitances of the two physical capacitors add. Although neither of the tunable current sources 16 and 26 are shown connected to a supply voltage, it is assumed that these tunable current sources are connected to some source of supply voltage at terminal 55, as is known in the art.

Each of the gm/C stages takes advantage of the relationship between the transconductance (gm) and the collector current $I_c$ of a bipolar junction transistor (BJT). The transconductance gm of a BJT is linearly proportional to its collector current, hence the term translinear. The translinear relationship is expressed below in Eq. 1.

$$gm = I_c/V_t \quad (1)$$

Where $V_t$ is equal to the thermal voltage, kT/q, which evaluates to 25.85 mV at 300K.

The gm/C stage uses this translinear relationship to create a tunable integrator stage. Consider the first gm/C stage 12. An output signal $V_{OUT}$ appearing across the output terminals 22 and 24 is equal to the current through the capacitor C3 ($I_{C3}$) multiplied by the impedance of the capacitor C3 ($1/s \times C_3$). The current through the capacitor $I_{C3}$ can be expressed as the transconductance (gm) of the transistors Q1 and Q2 times the input voltage ($V_{IN}$) appearing on the input terminals 18 and 20 of the gm/C stage. Substituting this expression for I in the previous equation, the output voltage can be expressed by the following equation:

$$V_{OUT} = gm \times V_{IN}/S \times C3 \quad (2)$$

The above expression can be put in a form of an integrator ($V_{OUT} = V_{IN} \times 1/S \times T$) yielding a time constant T equal to C3/gm. Therefore, the time constant of the gm/C stage is a function of the transconductance of the transistors, which is further a linear function of the collector current. The capacitor C3, in the preferred embodiment, is formed by two "back-to-back" capacitors so that their capacitances are additive.

The oscillator according to the invention takes advantage of this relationship to provide a tunable quadrature oscillator based on differential gm/C cells by varying the current in the tunable current sources 16 and 26. The first and second gm/C stages are connected so as to introduce an inversion or a 180 degree phase shift in the loop.

As shown in FIG. 3, the output terminals 22 and 24 of the first stage are connected to the input terminals 28 and 30, respectively, of the second stage. The output terminals 32 and 34 of the second stage are connected to input terminals 20 and 18, respectively, of the first stage. By cross-coupling the output terminals in this way, a signal appearing on the input terminals 18 and 20 is 180 degrees out of phase with a concomitant signal appearing on the input terminals 28 and 30, whereby the oscillator oscillates.

Associated with each gm/C stage is a common mode bias circuit and a startup circuit. The first gm/C stage has a first common mode bias circuit 36 coupled to the common mode terminals 23 and 25 of the first stage. The common mode bias circuit 36 is a means for providing common mode bias current to the first gm/C stage 12. The invention as described herein includes numerous embodiments of the common mode bias circuit 36, which are described below. The common mode bias circuit 36 can also include amplitude limiting means for limiting the amplitude of oscillation of the signal appearing on the output terminals 22 and 24.

Each gm/C stage can further include an optional startup circuit 38 or 42 coupled thereto. The function of the startup circuit is to ensure that the oscillator starts oscillating. The startup circuit accomplishes this by moving the complex conjugate poles of the gm/C stage towards the right hand plane. In the ideal case, the startup circuit would position the complex conjugate poles along the imaginary axis. However, in practice, the startup circuit actually moves the complex conjugate poles into the right hand plane. In this case, the amplitude limiting means of the common mode bias circuit keeps the amplitude of the output signal from growing out of bounds. Some embodiments of the invention do not require this start-up circuit, as will be shown below.

Figure 4:
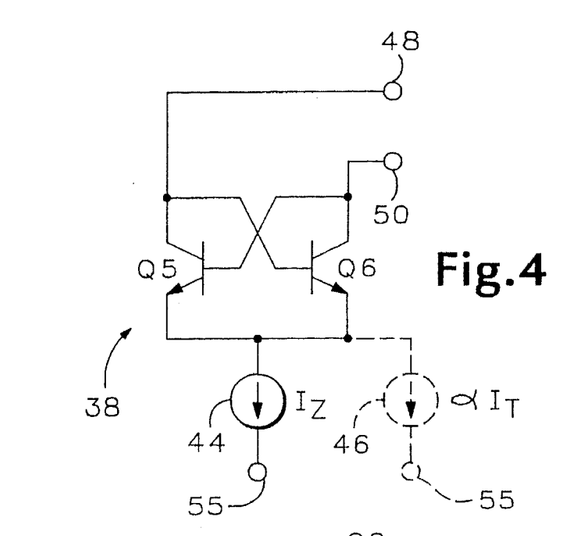
FIG. 4 is a schematic of the startup circuit of FIG. 3.

Referring now to FIG. 4, the preferred embodiment of the startup circuit 38 is shown. The startup circuit 38 includes a cross-coupled pair of transistors Q5 and Q6 and a current source 44 coupled to the emitters thereof. The transistors Q5 and Q6 are connected so that the collector of one transistor is connected to the base of the other transistor to form the cross-coupled connection. The collector of transistor Q5 forms a terminal 48 that is coupled to one of the output terminals of the first gm/C stage while the collector of transistor Q6 forms another terminal 50 which is coupled to the other output terminal of the first gm/C stage.

The startup circuit 38 produces a negative resistance, as seen looking in terminals 48 and 50, which compensates for the input resistance of the next gm/C stage 14. If the negative resistance of the startup circuit 38 were exactly equal to, in absolute value terms, the input resistance of the second gm/C stage the complex conjugate poles of the first gm/C stage would lie exactly on the imaginary axis. Because this balance is difficult to achieve in practical circuits, in the preferred embodiment, the negative resistance of the startup circuit 38 is made greater than, in absolute value terms, the input resistance of the second gm/C stage so as to push the complex conjugate poles of the first gm/C stage into the right hand side of the plane. An amplitude limiting means, discussed below, is then used to compensate for this instability.

As will be apparent to those skilled in the art, the negative resistance of the startup circuit 38 is a function of the current $I_Z$ produced by current source 44. One of ordinary skill in the art could select a current $I_Z$ that would produce the desired negative resistance. In order to ensure oscillation, the current $I_Z$ produced by the current source of the associated startup circuit must be equal to $K \times I_T$, where K is greater than 1. The final amplitude of the signal appearing on the output terminals is then a function of K.

The startup circuit 38 can also include a second current source 46, which produces a current $\alpha \times I_T$, where $I_T$ is equal to the current produced by the tunable current source 46. This additional current source 46 can be included where the common mode bias circuit 36 includes resistors coupled between a positive supply voltage and a corresponding common mode terminal, as described further below. The startup circuit 42 of the second gm stage 14 is substantially identical to the startup circuit 38 and is therefore not shown in detail.

Figure 5:
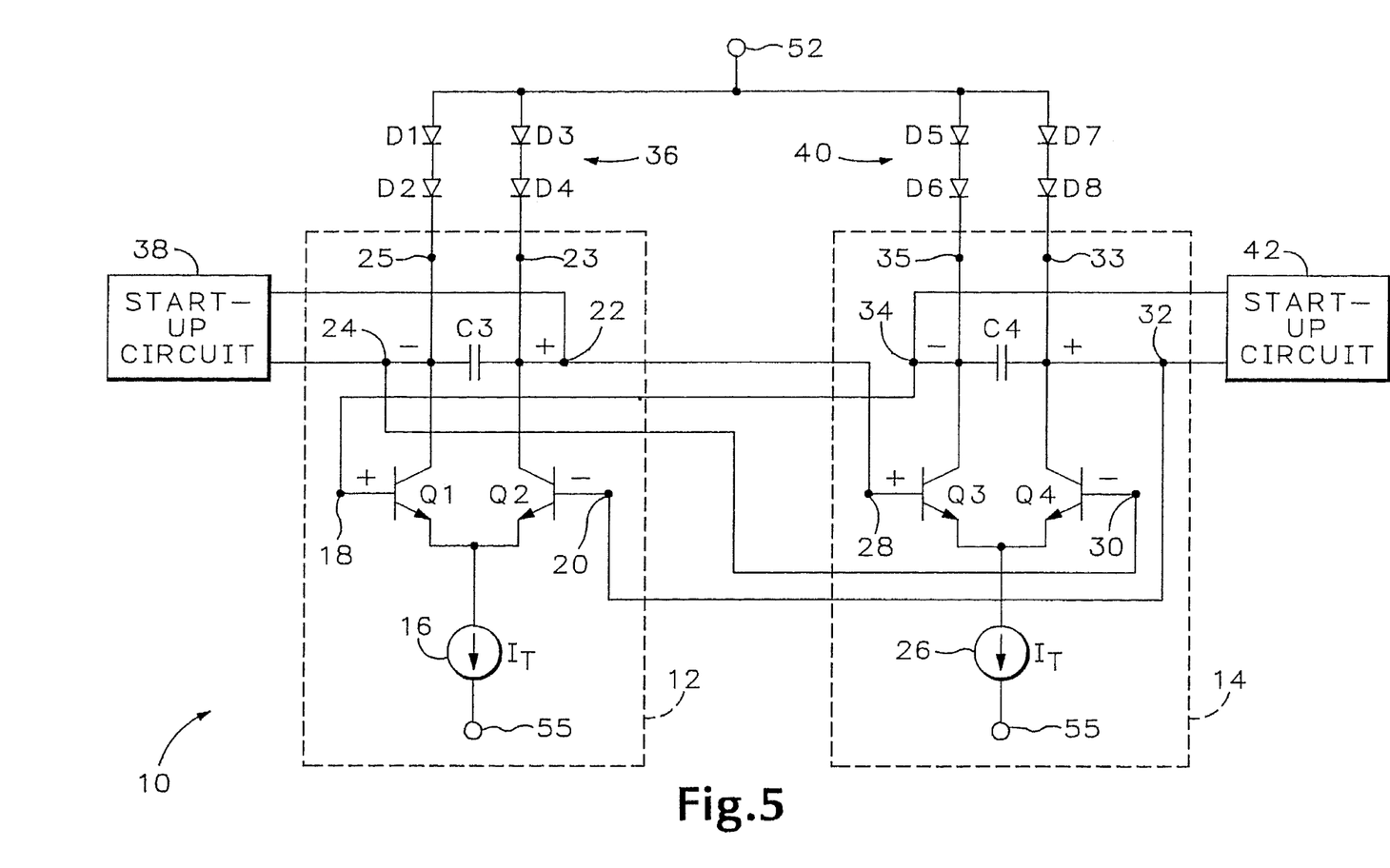
FIG. 5 is a schematic diagram of another embodiment of the current-controlled quadrature oscillator according to the invention.

Referring now to FIG. 5, a first embodiment of the common mode biasing circuits 36 and 40 is shown. This embodiment includes two pairs of biasing diodes, e.g., D1–D2 and D3–D4. The two diodes in each pair are connected in series. Each pair of biasing diodes is coupled between a positive supply voltage supplied to positive supply terminal 52 and a respective one of the output terminals of the associated gm/C stage. These diodes can be implemented either as discrete diodes or as diode-connected transistors, as is known in the art.

Figure 6:
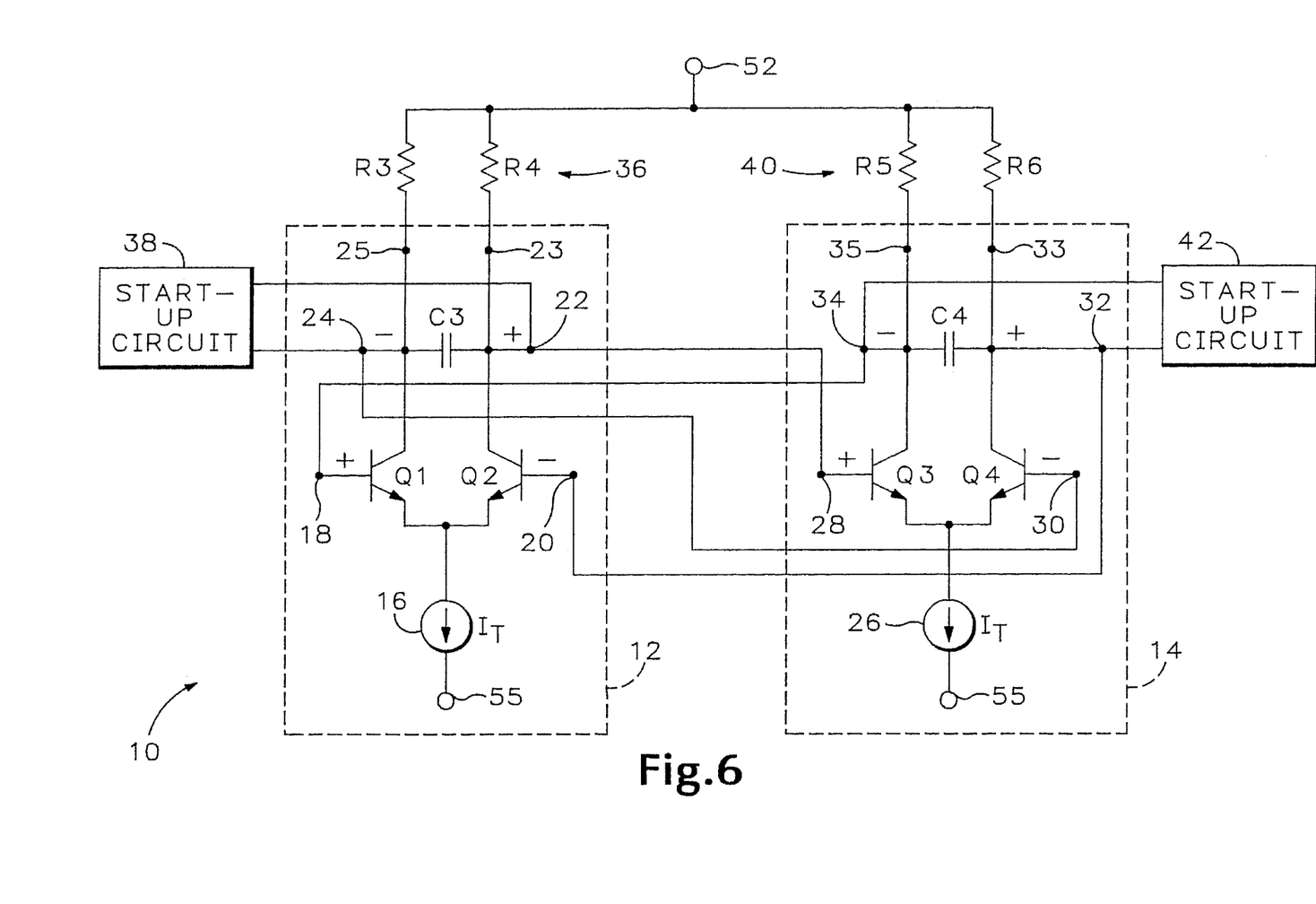
FIG. 6, 7 and 8 are schematic diagram of still other embodiments of the current-controlled quadrature oscillator according to the invention.

Referring now to FIG. 6, an alternative embodiment of the common mode biasing circuits 36 and 40 is shown. In this embodiment, the common mode biasing circuits include a pair of biasing resistors, e.g., R3 and R4, with each one of the pair of biasing resistors being coupled between the positive supply voltage and a respective one of the pair of output terminals of the associated gm/C stage. If this common mode biasing circuit is used, an additional current source can be used in the startup circuit such as current source 46 of FIG. 4.

Figure 7:
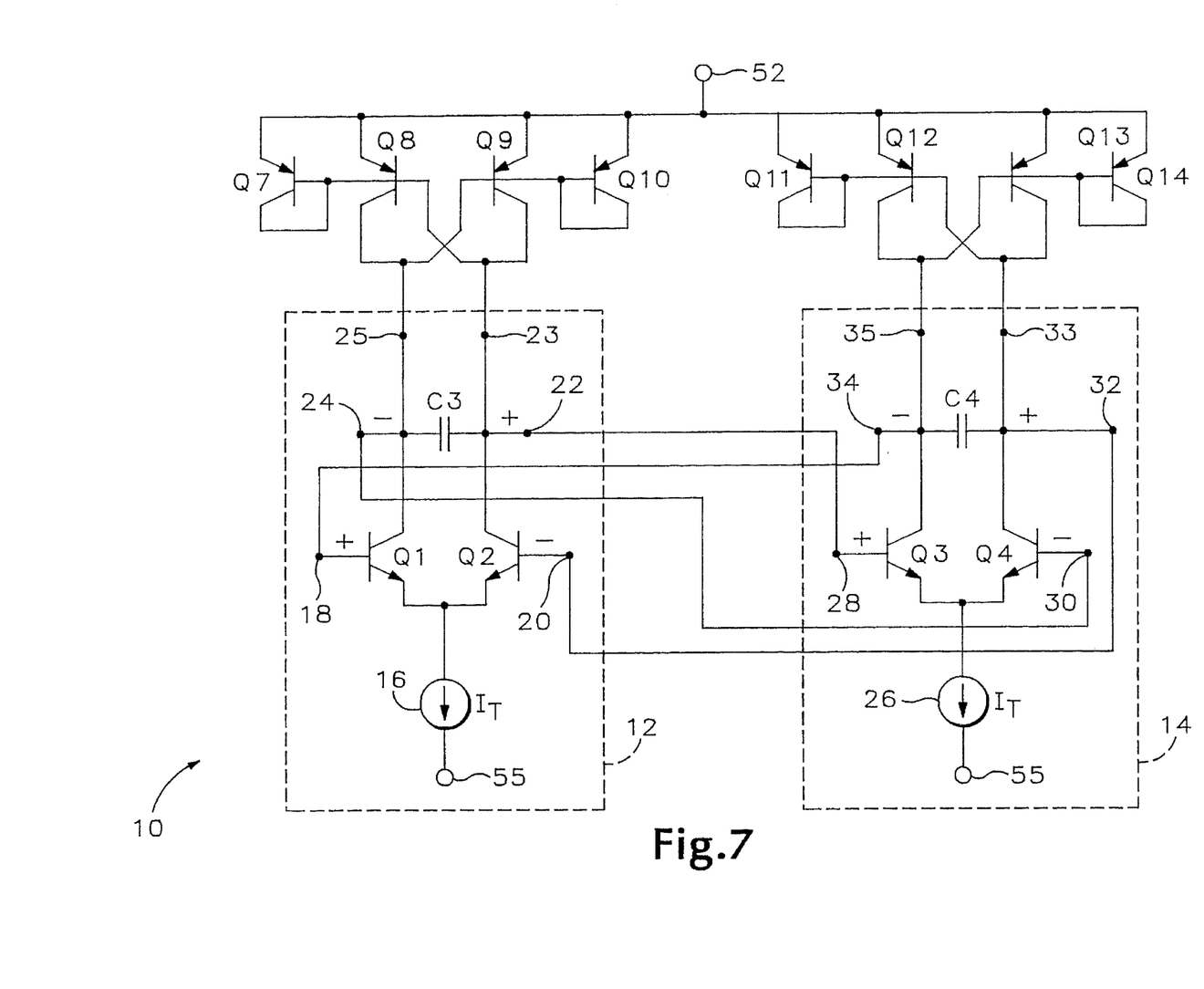

Referring now to FIG. 7, the yet further embodiment of the common mode biasing circuits 36 and 40 is shown. This embodiment includes two current mirrors. For example, the first common mode biasing circuit 36 is comprised of a first current source including a first diode-connected transistor Q7 and a first mirror transistor Q8. The common mode biasing circuit 36 also includes a second current mirror comprised of a second diode-connected transistor Q10 and a second mirror transistor Q9. In the preferred embodiment, the diode-connected transistors and the mirror transistors are PNP transistors.

As shown in FIG. 7, the emitters of the transistors Q7–Q10 are coupled to the positive supply voltage at terminal 52. As also shown therein, the collector of the diode-connected transistors are coupled to a respective one of the common mode terminals while the collector of the associated mirror transistor is coupled to the other common mode terminal. The second common mode biasing circuit 40 is connected in substantially identical fashion to the second gm/c stage 14.

In the preferred embodiment of this implementation of the common mode biasing circuits, the emitter areas of the diode-connected transistor and the associated mirror transistor have a ratio equal to $1:1+\Delta$. This additional emitter area provides a regeneration current by which the gm/C stage oscillates. Thus, this common-mode biasing means eliminates the need for a start-up circuit.

Figure 8:
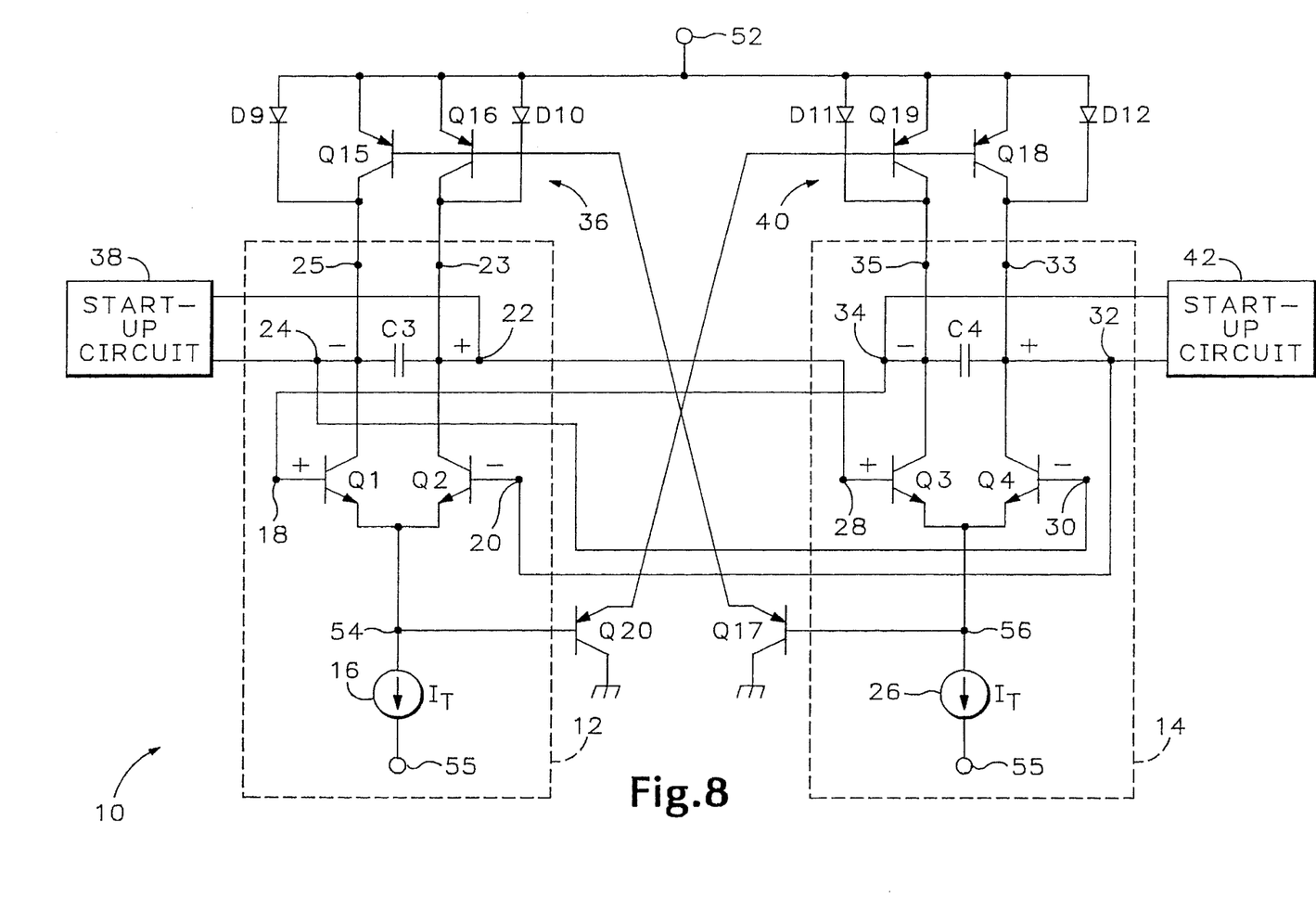

Referring now to FIG. 8, another embodiment of the common mode biasing circuits 36 and 40 is shown. In the embodiment shown in FIG. 8, the common mode biasing circuits include a pair of common mode transistors and a biasing transistor. The biasing transistors are coupled between the positive supply voltage and the common mode terminals of the associated gm/C stage, with each one of the pair of common mode transistors being coupled between the positive supply voltage and the respective one of the common mode terminals. Each of the common mode transistors further includes a control terminal. In the preferred embodiment, the control terminal is the base of the transistors. The biasing transistor includes a control terminal coupled to the opposite gm/C stage, and a load terminal coupled to the control terminals of the associated pair of common mode transistors.

Specifically, the common mode biasing circuit 36 includes common mode transistors Q15 and Q16 and a biasing transistor Q17. In the preferred embodiment, the pair of common mode transistors and the biasing transistor are PNP transistors. The PNP transistors can be formed either using a complementary bipolar process or, in the event such a complementary process is unavailable, the pair of common mode transistors can be formed as lateral transistors and the biasing transistor can be formed as a vertical transistor. Although a lateral PNP transistor has a lower current gain and a low cutoff frequency, this does not limit the bandwidth of the oscillator because these common mode transistors are just being used for biasing.

As shown in FIG. 8, the base of the biasing transistor Q17 is coupled to the second gm/C stage 14 at node 56. Although the biasing transistor Q17 consumes some base current, this does not produce an undesirable effect on the oscillator circuit. For example, the base current required by biasing transistor Q17 ($I_{17}$) can be shown to be equal to $(I_T/2/(\beta_{16} \times \beta_{17})$.

The oscillator circuit of FIG. 8 also includes means for limiting the amplitude of a signal appearing across the output terminals of the gm/C stages. The limiting means for the first gm/C stage 12 includes diodes D9 and D10 and the limiting means for the second gm/C stage 14 includes diodes D11 and D12. These amplitude limiting diodes D9–D12 limit the amplitude at the corresponding output terminals to a predetermined range, e.g., 200 mV. These amplitude limiting diodes prevent the oscillator from becoming unstable in the event the startup circuits 38 and 42 place the complex conjugate poles of the associated gm/C stages into the right hand plane.

Figure 9:
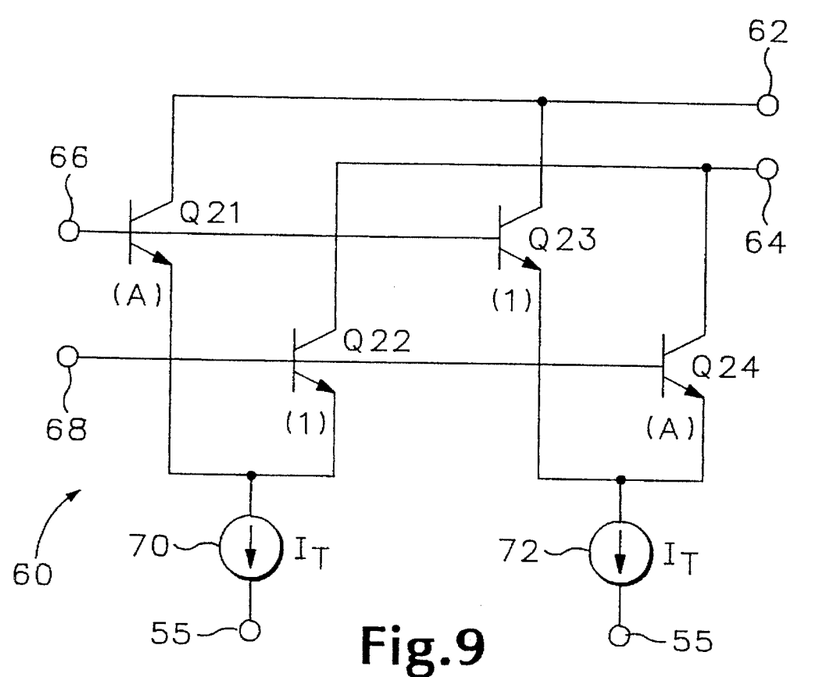
FIG. 9 is a schematic diagram of a multi-tanh doublet that can be used in place of the differential pair in the gm/C stages of FIG. 3.

Referring now to FIG. 9, an alternative embodiment of the gm portion of the gm/C stage is shown generally at 60. The circuit 60 is referred to herein as a multi-tanh doublet. The multi-tanh doublet 57 makes the gm stages more linear by effectively combining two differential pairs into a single gm stage. The multi-tanh doublet derives its name from the current versus voltage relationship of a simple BJT differential pair, which can be described by a tanh function. The multi-tanh doublet includes two BJT differential pairs, each operating at different operating points so as to extend the linear range of the gm stage.

Figure 10:
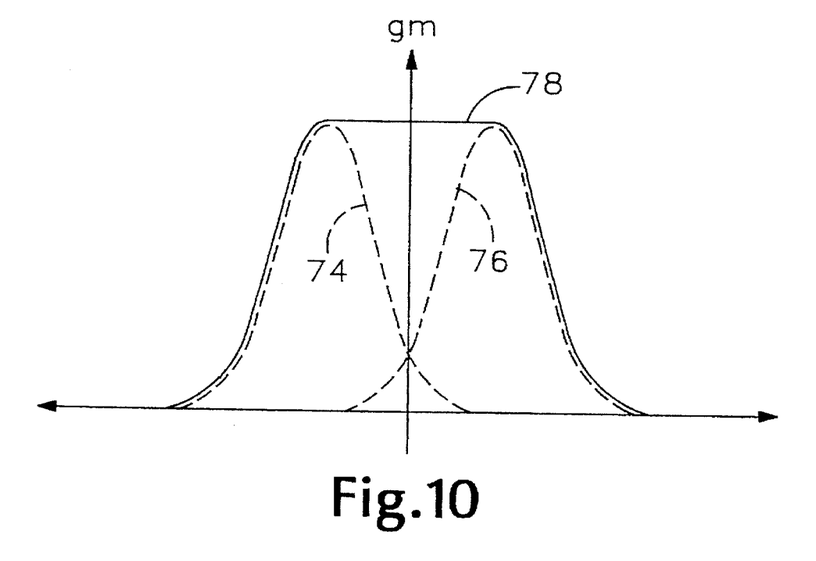
FIG. 10 is a plot of the transconductance of the multi-tanh doublet of FIG. 9.

The improved linearity of the multi-tanh doublet 60 can be seen by reference to the transconductance (gm) plots in FIG. 10. The transconductance gm, i.e., the differential incremental gain, of a BJT differential pair is given by a $sech^2$ function, as is known in the art. In FIG. 10, a first plot 74 for the differential pair consisting of transistors Q21 and Q22 is shown. A second plot 76 for the differential pair consisting of transistors Q23 and Q24 is also shown. The two plots indicate the different operating points of the two differential pairs. Plot 78 represents the sum of the two plots 74 and 76, which corresponds to the combined transconductance of the multi-tanh doublet 60. As can be seen by the plot 78, the gm of the doublet 60 has an extended linear range. This principle can be extended to any number of differential pairs yielding a generic multi-tanh n-tuplet to produce a further extended linear range of transconductance. These multi-tanh n-tuplets can be substituted for the simple BJT differential pairs of the oscillators shown in the FIGS. 3–8.

Figure 11:
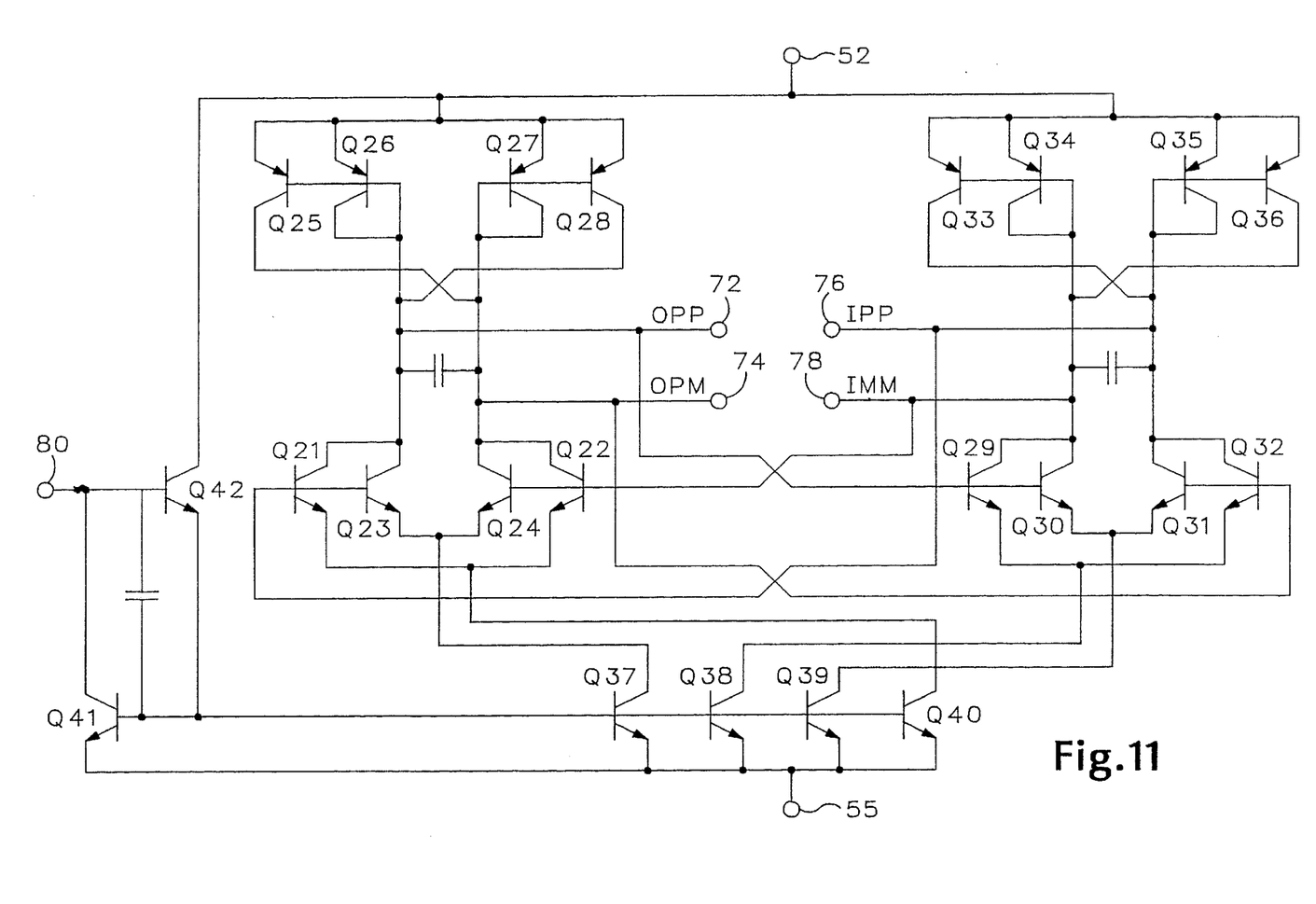
FIG. 11 is a schematic diagram of another embodiment of the current-controlled quadrature oscillator according to the invention which uses the multi-tanh doublet of FIG. 9.

A schematic diagram of another embodiment of a current-controlled quadrature oscillator which uses the multi-tanh doublet of FIG. 9 is shown in FIG. 11. The first gm/C stage 12 includes a multi-tanh doublet comprised of transistors Q21–Q24. The multi-tanh doublet of the second gm/C stage 14 includes transistors Q29–Q31.

Each of the transistor pairs, e.g., Q21–Q22, are coupled to a respective controllable current source for controlling the collector currents and, therefore, the transconductance of the transistor pair. In the embodiment shown in FIG. 11, the current sources are comprised of single transistors (Q37–Q40) with the collector of each transistor being coupled to the emitters of the corresponding pair. Many other embodiments of the current sources can be used.

The oscillator 10 of FIG. 11 also includes a front end circuit including transistors Q41 and Q42 and capacitor C5. The front end circuit is coupled to the bases of transistors Q37–Q40 for providing a bias current thereto. The front end circuit includes a control terminal 80 for receiving a control signal thereon. The front end circuit supplies the bias current to the transistors Q37–Q40 responsive to a control signal received on terminal 80. Other front-end circuits can be used for generating the bias current responsive to the control signal, as is known in the art.

In operation, the transistors Q37–Q40, responsive to the bias current, alter the collector currents therethrough, which in turn changes the transconductance (gin) of the respective gm/C stage. This change in transconductance changes the dominant pole of the stage. Therefore, by changing the control signal on terminal 80, the oscillation frequency of the oscillator can be tuned over a wide range of frequencies given the translinear principle on which the gm/C stages operate.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. An oscillator comprising:

a first gm/C integrator stage having a first pair of input terminals, a first pair of output terminals, and a first pair of common-mode terminals;

a first common-mode biasing means coupled between a supply voltage and the first pair of common-mode terminals;

a second gm/C integrator stage having a second pair of input terminals, a second pair of output terminals, and a second pair of common-mode terminals;

a second common-mode biasing means coupled between a supply voltage and the second pair of common-mode terminals; and wherein the first pair of output terminals is coupled to the second pair of input terminals and the second pair of output terminals is cross-coupled to the first pair of input terminals such that a signal appearing on the first pair of input terminals is 180 degrees out of phase with a concomitant signal appearing on the second pair of input terminals whereby the oscillator oscillates.

2. An oscillator according to claim 1 further including:

a first start-up means coupled to the first pair of output terminals; and a second start-up means coupled to the second pair of output terminals.

3. An oscillator according to claim 2 wherein the first start-up means includes means for producing a negative resistance, wherein the absolute value of the negative resistance is equal to or greater than the absolute value of an input resistance of the second gm/C integrator stage.

4. An oscillator according to claim 2 wherein the first start-up means includes:

a pair of cross-coupled transistors; and a current source coupled to the pair of cross-coupled transistors for providing a bias current thereto.

5. An oscillator according to claim 2 further including means coupled between the supply voltage and the first pair of output terminals for limiting the amplitude of a signal appearing across the first pair of output terminals.

6. An oscillator according to claim 5 wherein the means coupled between the supply voltage and the first pair of output terminals for limiting the amplitude of a signal appearing across the first pair of output terminals includes a first pair of amplitude limiting diodes, wherein each one of the first pair of amplitude limiting diodes is coupled between the supply voltage and a respective one of the first pair of output terminals.

7. An oscillator according to claim 2 wherein the first common-mode biasing means includes a first pair of biasing resistors, each one of the first pair of biasing resistors coupled between the supply voltage and a respective one of the first pair of output terminals.

8. An oscillator according to claim 2 wherein the first common-mode biasing means includes a first pair of biasing diodes connected in series and a second pair of biasing diodes connected in series, each pair of biasing diodes coupled between the supply voltage and a respective one of the first pair of output terminals.

9. An oscillator according to claim 1 wherein the first common-mode biasing means includes:
   a first current mirror including a first diode-connected transistor having a base and being coupled between the supply voltage and a first one of the first pair of output terminals and including a first mirror transistor having a base and being coupled between the supply voltage and a second one of the first pair of output terminals, the base of the first diode-connected transistor being coupled to the base of the first mirror transistor; and
   a second current mirror including a second diode-connected transistor having a base and being coupled between the supply voltage and the second one of the first pair of output terminals and including a second mirror transistor having a base and being coupled between the supply voltage and the first one of the first pair of output terminals, the base of the second diode-connected transistor being coupled to the base of the second mirror transistor.

10. An oscillator according to claim I wherein the first gm/C integrator stage includes a first multi-tanh n-tuplet.

11. An oscillator comprising:
   a first gm/C integrator stage having a first pair of input terminals, a first pair of output terminals, and a first pair of common-mode terminals;
   a first pair of common-mode transistors coupled between a supply voltage and the first pair of common-mode terminals, each one of the first pair of common mode transistors being coupled between the supply voltage and a respective one of the first pair of common-mode terminals, each one of the first pair of common mode transistors having a control terminal;
   a first common-mode biasing transistor having a control terminal coupled to a second gm/C integrator stage and a load terminal coupled to the control terminals of the first pair of common-mode transistors;
   a first start-up means coupled to the first pair of output terminals;
   the second gm/C integrator stage having a second pair of input terminals, a second pair of output terminals, and a second pair of common-mode terminals;
   a second pair of common-mode transistors coupled between the supply voltage and the second pair of common-mode terminals, each one of the second pair of common mode transistors being coupled between the supply voltage and a respective one of the second pair of common-mode terminals, each one of the second pair of common mode transistors having a control terminal;
   a second common-mode biasing transistor having a control terminal coupled to the first gm/C integrator stage and a load terminal coupled to the control terminals of the second pair of common-mode transistors; and
   a second start-up means coupled to the second pair of output terminals;
   wherein the first pair of output terminals is coupled to the second pair of input terminals and the second pair of output terminals is cross-coupled to the first pair of input terminals such that a signal appearing on the first pair of input terminals is 180 degrees out of phase with a concomitant signal appearing on the second pair of input terminals whereby the oscillator oscillates.

12. An oscillator according to claim 11 wherein the first pair of common-mode transistors include a first pair of lateral PNP transistors.

13. An oscillator according to claim 11 wherein the first pair of common-mode transistors include a first pair of complementary bipolar PNP transistors.

14. An oscillator according to claim 11 wherein the first common-mode biasing transistor includes a vertical PNP transistor.

15. An oscillator according to claim 11 wherein the first start-up means includes:
   a first pair of cross-coupled transistors coupled to the first pair of output terminals; and
   a first biasing current source coupled to the first pair of cross-coupled transistors.

16. An oscillator according to claim 15 further including means coupled between the supply voltage and the first pair of output terminals for limiting the amplitude of a signal appearing across the first pair of output terminals.

17. An oscillator according to claim 16 wherein the means coupled between the supply voltage and the first pair of output terminals for limiting the amplitude of a signal appearing across the first pair of output terminals includes a first pair of amplitude limiting diodes, wherein each one of the first pair of amplitude limiting diodes is coupled between the supply voltage and a respective one of the first pair of output terminals.

18. An oscillator comprising:
   a first gm/C integrator stage having a first pair of input terminals, a first pair of output terminals, and a first pair of common-mode terminals;
   a first common-mode biasing means coupled between a supply voltage and the first pair of common-mode terminals;
   a first pair of cross-coupled transistors coupled to the first pair of output terminals;
   a first biasing current source coupled to the first pair of cross-coupled transistors;
   a second gm/C integrator stage having a second pair of input terminals, a second pair of output terminals, and a second pair of common-mode terminals;
   a second common-mode biasing means coupled between a supply voltage and the second pair of common-mode terminals; and
   a second pair of cross-coupled transistors coupled to the second pair of output terminals; and
   a second biasing current source coupled to the second pair of cross-coupled transistors;
   wherein the first pair of output terminals is coupled to the second pair of input terminals and the second pair of output terminals is cross-coupled to the first pair of input terminals such that a signal appearing on the first pair of input terminals is 180 degrees out of phase with a concomitant signal appearing on the second pair of input terminals whereby the oscillator oscillates.

19. An oscillator according to claim 18 further including means coupled between the supply voltage and the first pair of output terminals for limiting the amplitude of a signal appearing across the first pair of output terminals.

20. An oscillator according to claim 19 further including means coupled between the supply voltage and the second pair of output terminals for limiting the amplitude of a signal appearing across the second pair of output terminals.

21. An oscillator according to claim 19 wherein the means coupled between the supply voltage and the first pair of output terminals for limiting the amplitude of a signal appearing across the first pair of output terminals includes a first pair of amplitude limiting diodes, wherein each one of the first pair of amplitude limiting diodes is coupled between the supply voltage and a respective one of the first pair of output terminals.

22. An oscillator according to claim 18 wherein the first common-mode biasing means coupled between a supply voltage and the first pair of common-mode terminals includes:

a first pair of common-mode transistors coupled between a supply voltage and the first pair of common-mode terminals, each one of the first pair of common mode transistors being coupled between the supply voltage and a respective one of the first pair of common-mode terminals, each one of the first pair of common mode transistors having a control terminal; and a first common-mode biasing transistor having a control terminal coupled to the second gm/C integrator stage and a load terminal coupled to the control terminals of the first pair of common-mode transistors.

23. An oscillator according to claim 18 wherein the first common-mode biasing means coupled between a supply voltage and the first pair of common-mode terminals includes:

a first current mirror including a first diode-connected transistor having a base and being coupled between the supply voltage and a first one of the first pair of output terminals and including a first mirror transistor having a base and being coupled between the supply voltage and a second one of the first pair of output terminals, the base of the first diode-connected transistor being coupled to the base of the first mirror transistor; and a second current mirror including a second diode-connected transistor having a base and being coupled between the supply voltage and the second one of the first pair of output terminals and including a second mirror transistor having a base and being coupled between the supply voltage and the first one of the first pair of output terminals, the base of the second diode-connected transistor being coupled to the base of the second mirror transistor.

24. An oscillator according to claim 23 wherein the first diode-connected transistor is a PNP transistor having a base, an emitter, and a collector, the emitter of the first diode-connected transistor being coupled to the supply voltage and the collector of the first diode-connected transistor being coupled to one of the first pair of output terminals;

wherein the first mirror transistor is a PNP transistor having a base, an emitter, and a collector, the emitter of the first mirror transistor being coupled to the supply voltage and the collector of the first mirror transistor being coupled to the other one of the first pair of output terminals; and wherein the base of the first diode-connected transistor is coupled to the base of the first mirror transistor.

25. An oscillator according to claim 24 wherein the ratio of the first diode-connected transistor emitter area to the first mirror transistor emitter area is equal to 1:1+δ.

26. An oscillator according to claim 18 wherein the first gm/C integrator stage includes:

a first differential pair of transistors, each transistor having a base, a collector, and an emitter, wherein the collectors of the differential pair comprise the first pair of output terminals;

a first capacitor coupled across the first pair of output terminals; and a first controllable current source coupled to the emitters of the differential pair of transistors, wherein the frequency of oscillation is responsive to the current in the first controllable current source.

27. An oscillator according to claim 26 wherein the first capacitor includes a pair of capacitors connected in parallel.

28. An oscillator comprising:

a first gm/C integrator stage having a first pair of input terminals, a first pair of output terminals, and a first pair of common-mode terminals;

a first common-mode biasing circuit coupled between a supply voltage and the first pair of common-mode terminals;

a second gm/C integrator stage having a second pair of input terminals, a second pair of output terminals, and a second pair of common-mode terminals;

a second common-mode biasing circuit coupled between a supply voltage and the second pair of common-mode terminals; and wherein the first pair of output terminals is coupled to the second pair of input terminals and the second pair of output terminals is cross-coupled to the first pair of input terminals such that a signal appearing on the first pair of input terminals is 180 degrees out of phase with a concomitant signal appearing on the second pair of input terminals whereby the oscillator oscillates.

29. An oscillator according to claim 28 wherein the first common mode biasing circuit comprises:

a first biasing transistor being coupled between the supply voltage and a first one of the first pair of common mode terminals, the first biasing transistor having a control terminal coupled to a second one of the first pair of common mode terminals;

a first diode coupled between the supply voltage and the control terminal of the first biasing transistor;

a second biasing transistor being coupled between the supply voltage and the second one of the first pair of common mode terminals, the second biasing transistor having a control terminal coupled to the first one of the first pair of common mode terminals; and a second diode coupled between the supply voltage and the control terminal of the second biasing transistor.

30. An oscillator according to claim 28 further comprising means for tuning the oscillator.

31. An oscillator according to claim 30 wherein the means for tuning the oscillator includes:

a tuning transistor having a control terminal, a bias terminal, and a supply terminal, the control terminal for receiving a frequency control signal, the bias terminal being coupled to the first and second gm/C stages for providing a bias current thereto, and the supply terminal being coupled to the supply voltage.

32. An oscillator according to claim 31 wherein the means for tuning the oscillator further includes:

a capacitor coupled between the control terminal and the bias terminal of the tuning transistor; and a biasing transistor coupled to the tuning transistor.

33. An oscillator according to claim 31 wherein the first and second gm/C stages include first and second tunable current sources, respectively.

34. An oscillator according to claim 33 wherein the bias terminal of the tuning transistor is coupled to the first and second tunable current sources to modulate the current supplied by the tunable current sources, wherein the frequency of oscillation modulates responsive thereto.

35. A method of tuning an oscillation frequency of an oscillation signal generated by an oscillator having a pair of gm/C integrator stages, each gm/C stage having a tunable current source coupled thereto for sourcing current from the associated gm/C stage, the method comprising:

cross-coupling the pair of gm/C stages to form a closed loop;

applying a control signal to the oscillator;

altering the currents through the gm/C stages responsive to the control signal; and altering the transconductance (gm) of the integrator stages responsive to the alteration in the currents wherein the oscillation frequency is tuned.

36. A method of tuning an oscillation frequency of an oscillator according to claim 35 including starting up the oscillator.

37. A method of tuning an oscillation frequency of an oscillator according to claim 36 wherein the step of starting up the oscillator includes locating a pole for each gm/C stage in the right hand plane.

38. A method of tuning an oscillation frequency of an oscillator according to claim 37 wherein the step of locating a pole for each gm/C stage in the right hand plane includes providing a negative impedance to each gm/C stage.

39. A method of tuning an oscillation frequency of an oscillator according to claim 35 wherein the step of altering the currents through the gm/C stages responsive to the control signal includes supplying a bias current to the tunable current sources responsive to the control signal.

40. A method of tuning an oscillation frequency of an oscillator according to claim 35 including providing a common-mode bias current to each of the gm/C stages.

41. A method of tuning an oscillation frequency of an oscillator according to claim 35 including limiting the amplitude of the oscillation.

* * * * *